(12) United States Patent
Levander et al.

(10) Patent No.: US 9,177,967 B2
(45) Date of Patent: Nov. 3, 2015

(54) HETEROGENEOUS SEMICONDUCTOR MATERIAL INTEGRATION TECHNIQUES

(71) Applicant: Intel Corporation, Santa Clara, CA (US)

(72) Inventors: Alejandro X. Levander, Santa Clara, CA (US); Kimin Jun, Hillsboro, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 14/139,954

(22) Filed: Dec. 24, 2013

(65) Prior Publication Data
US 2015/0179664 A1     Jun. 25, 2015

(51) Int. Cl.
| | |
|---|---|
| *H01L 27/00* | (2006.01) |
| *H01L 21/00* | (2006.01) |
| *H01L 27/12* | (2006.01) |
| *H01L 21/762* | (2006.01) |
| *H01L 21/265* | (2006.01) |
| *H01L 21/3105* | (2006.01) |

(Continued)

(52) U.S. Cl.
CPC ...... *H01L 27/1203* (2013.01); *H01L 21/02634* (2013.01); *H01L 21/02647* (2013.01); *H01L 21/265* (2013.01); *H01L 21/31053* (2013.01); *H01L 21/31111* (2013.01); *H01L 21/76251* (2013.01)

(58) Field of Classification Search
CPC ....... H10L 33/32; H10L 33/007; H10L 33/12; H10L 33/16; H10L 21/0262; H10L 21/02647; H10L 21/02665; H10L 21/76251; H10L 21/31111; H10L 21/02634; H10L 21/265; H10L 21/31053; H10L 27/1203

USPC .............. 257/190, 94, 76; 438/22, 47, 94
See application file for complete search history.

(56) References Cited

U.S. PATENT DOCUMENTS

| | | | | |
|---|---|---|---|---|
| 7,626,246 | B2 * | 12/2009 | Lochtefeld et al. | 257/647 |
| 7,638,842 | B2 * | 12/2009 | Currie et al. | 257/347 |
| 7,875,958 | B2 * | 1/2011 | Cheng et al. | 257/617 |

(Continued)

OTHER PUBLICATIONS

Chang et al., "Optimization of growth condition for wide dislocation-free GaAs on Si substrate by microchannel epitaxy", 1998, Journal of Crystal Growth, vol. 193, pp. 18-22 (published on Aug. 15, 1998).*

(Continued)

*Primary Examiner* — Nikolay Yushin
(74) *Attorney, Agent, or Firm* — Finch & Maloney PLLC

(57) ABSTRACT

Techniques are disclosed for heteroepitaxial growth of a layer of lattice-mismatched semiconductor material on an initial substrate, and transfer of a defect-free portion of that layer to a handle wafer or other suitable substrate for integration. In accordance with some embodiments, transfer may result in the presence of island-like oxide structures on the handle wafer/substrate, each having a defect-free island of the lattice-mismatched semiconductor material embedded within its upper surface. Each defect-free semiconductor island may have one or more crystalline faceted edges and, with its accompanying oxide structure, may provide a planar surface for integration. In some cases, a layer of a second, different semiconductor material may be heteroepitaxially grown over the handle wafer/substrate to fill areas around the transferred islands. In some other cases, the handle wafer/substrate itself may be homoepitaxially grown to fill areas around the transferred islands.

25 Claims, 6 Drawing Sheets

(51) Int. Cl.
*H01L 21/02* (2006.01)
*H01L 21/311* (2006.01)

(56) References Cited

U.S. PATENT DOCUMENTS

| | | |
|---|---|---|
| 8,173,551 B2 | 5/2012 | Bai et al. |
| 2007/0054465 A1* | 3/2007 | Currie et al. ............... 438/455 |
| 2008/0073641 A1* | 3/2008 | Cheng et al. ................. 257/25 |
| 2010/0216277 A1 | 8/2010 | Fiorenza et al. |
| 2011/0210374 A1 | 9/2011 | Lochtefeld |
| 2011/0291247 A1 | 12/2011 | Letertre et al. |
| 2012/0199876 A1 | 8/2012 | Bai et al. |
| 2013/0252361 A1 | 9/2013 | Li et al. |

OTHER PUBLICATIONS

Langdo et al., "Highly quality Ge on Si by epitaxial necking", 2000, Applied Physics Letters, vol. 76, No. 25, pp. 3700-3702 (published on Jun. 19.*

International Search Report and Written Opinion, dated Feb. 26, 2015, received in International Patent Application No. PCT/US2014/066293, 13 pgs.

* cited by examiner

US 9,177,967 B2

HETEROGENEOUS SEMICONDUCTOR MATERIAL INTEGRATION TECHNIQUES

BACKGROUND

Integrated circuit design in the deep-submicron process nodes (e.g., 32 nm and beyond) involves a number of non-trivial challenges and has faced particular complications with respect to integration of heterogeneous semiconductor materials.

BRIEF DESCRIPTION OF THE DRAWINGS

FIG. 2' is an enlarged view of a portion of the IC of FIG. 2 illustrating an example constituent semiconductor structure of the semiconductor layer.

FIG. 9A' is an enlarged view of a portion of the IC of FIG. 9A.

FIG. 9B' is an enlarged view of a portion of the IC of FIG. 9B.

Figure 1:
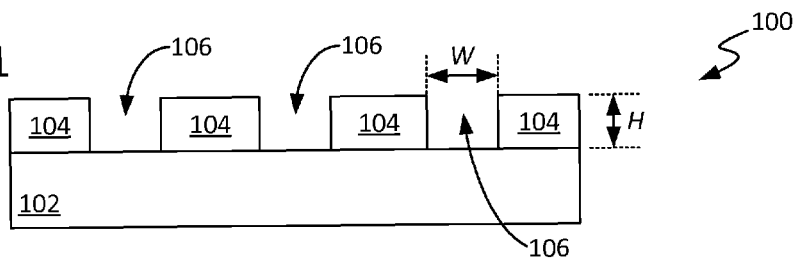
FIG. 1 is a cross-sectional view of an integrated circuit including a substrate and a patterned dielectric layer, in accordance with an embodiment of the present disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines, right angles, etc., and some features may have surface topography or otherwise be non-smooth, given real world limitations of fabrication processes. In short, the figures are provided merely to show example structures.

DETAILED DESCRIPTION

Techniques are disclosed for heteroepitaxial growth of a layer of lattice-mismatched semiconductor material on an initial substrate, and transfer of a defect-free portion of that layer to a handle wafer or other suitable substrate for integration. In accordance with some embodiments, transfer may result in the presence of island-like oxide structures on the handle wafer/substrate, each having a defect-free island of the lattice-mismatched semiconductor material embedded within its upper surface. Each defect-free semiconductor island may have one or more crystalline faceted edges and, with its accompanying oxide structure, may provide a planar surface for integration (e.g., upon which an additional layer and/or component can be populated). In some cases, a layer of a second, different semiconductor material may be heteroepitaxially grown over the handle wafer/substrate to fill areas around the transferred islands. In some other cases, the handle wafer/substrate itself may be homoepitaxially grown to fill areas around the transferred islands. Numerous configurations and variations will be apparent in light of this disclosure.

General Overview

Many materials that can be used for higher-mobility p-type and n-type metal-oxide-semiconductor (PMOS and NMOS) devices are lattice-mismatched to silicon. As a consequence, heteroepitaxial growth of such materials directly on silicon normally results in a high density of dislocation defects nucleating at the mismatched material interface. Existing approaches to reducing such defects for heterogeneous semiconductor integration utilize heteroepitaxial growth of the lattice-mismatched semiconductor material on a thick buffer layer. However, this buffer layer must be grown prior to the intended device layer, takes an extended amount of time to grow to the necessary thickness, and necessitates frequent chamber/tool cleaning maintenance, making it problematic for integration and increasing costs. In addition, if the buffer layer is grown on top of a wafer, then the resultant topography mismatch can result in lithography issues. Furthermore, the buffer layer is not readily scaled for use with etched trenches of high aspect ratio.

Thus, and in accordance with some embodiments of the present disclosure, techniques are disclosed for heteroepitaxial growth of a layer of lattice-mismatched semiconductor material on an initial substrate, and transfer of a defect-free portion of that layer to a handle wafer or other suitable substrate for integration. In accordance with some embodiments, transfer may result in the presence of one or more island-like oxide structures on the handle wafer/substrate, each having a defect-free island of the lattice-mismatched semiconductor material embedded within its upper surface. In some cases, a given defect-free semiconductor island may have one or more crystalline faceted edges. Also, in some cases, the oxide structure and its corresponding semiconductor island collectively may provide a planar surface for integration (e.g., upon which an additional layer and/or component can be populated). In some instances, a layer of a second, different semiconductor material may be heteroepitaxially grown over the handle wafer/substrate to fill areas around the one or more transferred islands. In some other instances, the handle wafer/substrate itself may be homoepitaxially grown to fill areas around the transferred one or more islands.

As described herein, a lattice-mismatched semiconductor material may begin its epitaxial growth within one or more wells patterned on an initial substrate, in accordance with some embodiments. Continued growth of the lattice-mismatched semiconductor layer out of the patterned wells may be provided, for example, using epitaxial lateral overgrowth (ELO). In accordance with some embodiments, the wells may be of sufficient aspect ratio, for example, to provide for aspect ratio trapping (ART) of dislocation defects therein. Thus, portions of the lattice-mismatched semiconductor layer which extend out of the wells may be completely or otherwise sufficiently defect-free and, as described herein, can be transferred, at least in part, to a handle wafer/substrate for integration. It should be noted that, as used herein, defect-free may refer to a layer of semiconductor material having no defects or any otherwise acceptable level of defects for a given target application or end-use.

Thereafter, the lattice-mismatched semiconductor layer may be planarized to form a flat surface, and an oxide layer may be deposited over the resultant topography for use in bonding and transfer to the handle wafer/substrate. To facilitate such transfer, the lattice-mismatched semiconductor material may undergo hydrogen (H+) ion implantation and subsequent hydrogen-based layer exfoliation to transfer the desired defect-free portions to the handle wafer/substrate. After exfoliation, the transferred defect-free portion and oxide layer may be planarized to form a flat surface, and the oxide layer can be etched, for example, to expose the underlying handle wafer/substrate.

In accordance with some embodiments, the resultant integrated circuit (IC) may include one or more islands of the lattice-mismatched semiconductor material which are embedded, at least in part, within an upper surface of a corresponding quantity of oxide structures formed over the underlying handle wafer/substrate. As previously noted, each semiconductor island may exhibit one or more crystalline faceted edges, and the semiconductor and oxide collectively may provide a substantially planar surface for integration. In some cases, after etching the oxide layer to reveal the underlying handle wafer/substrate, a layer of a different semiconductor material may be heteroepitaxially grown over the handle wafer/substrate to fill areas around the transferred islands. As will be appreciated in light of this disclosure, this may allow for integration of PMOS and NMOS devices on the same handle wafer/substrate. However, the present disclosure is not so limited, as in some other cases, the handle wafer/substrate itself may be homoepitaxially grown to fill areas around the transferred islands, after etching the oxide layer to reveal the underlying handle wafer/substrate. Whichever integration option is pursued, the resultant IC may have, in accordance with some embodiments, a substantially planar upper surface and may include an embedded, mismatched semiconductor layer with one or more crystalline faceted edges.

Some embodiments may eliminate or otherwise reduce the need to form a thick buffer layer, for example, like that previously discussed in the context of existing approaches. Some embodiments may provide for integration of a wide variety of lattice-mismatched semiconductor materials with silicon, thereby adding functionality and/or improving performance of NMOS/PMOS devices. Also, in accordance with some embodiments, use of the disclosed techniques may be detected, for example, by visual or other inspection (e.g., such as transmission electron microscopy, or TEM) of a given integrated circuit or other device having three-dimensional (e.g., island-like) semiconductor structures including crystalline faceted edges, as described herein.

Methodologies

Figure 7:
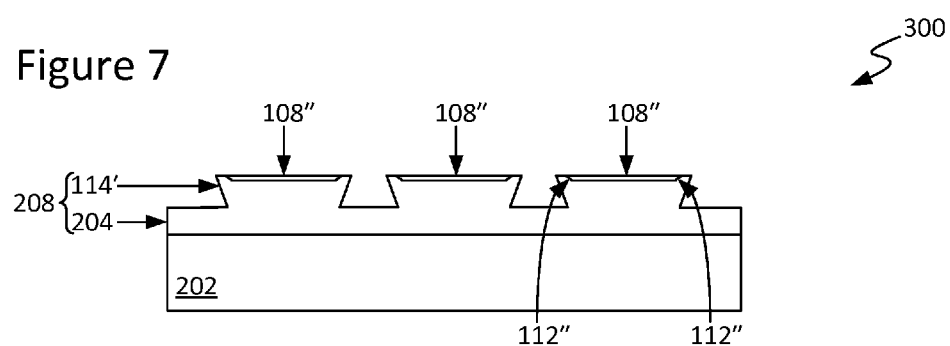
FIG. 7 is a cross-sectional view of the resultant IC of FIG. 6 after planarization thereof, in accordance with an embodiment of the present disclosure.
Figure 8:
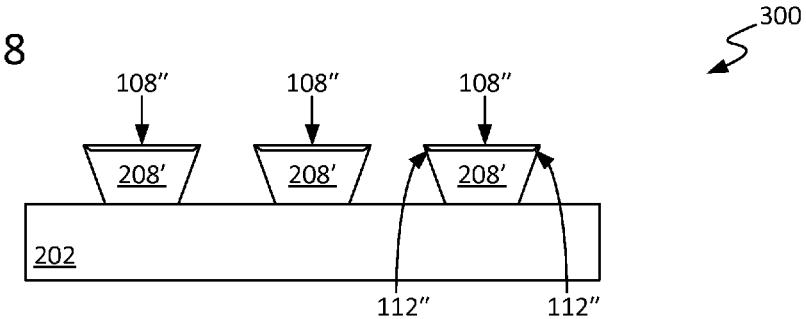
FIG. 8 is a cross-sectional view of the IC of FIG. 7 after etching thereof, in accordance with an embodiment of the present disclosure.
Figure 9A:
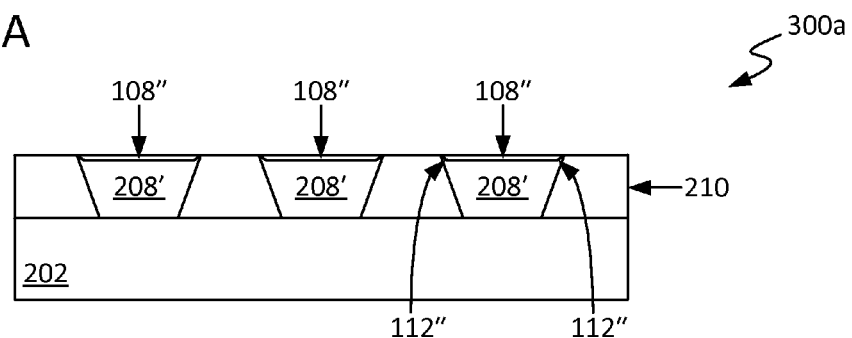
FIG. 9A is a cross-sectional view of the IC of FIG. 8 including an additional, different semiconductor layer, in accordance with an embodiment of the present disclosure.
Figure 9A:
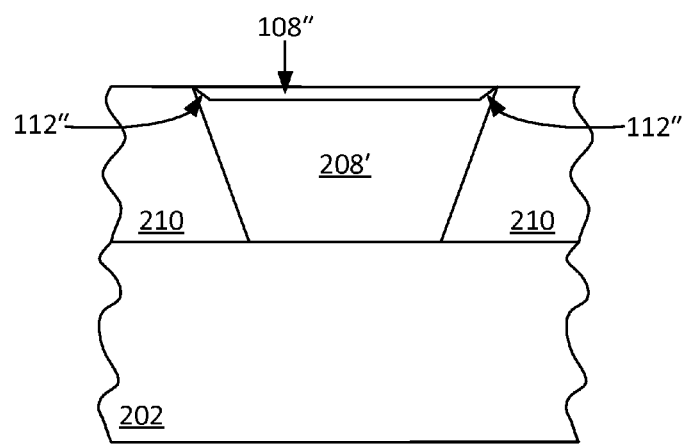
Figure 9B:
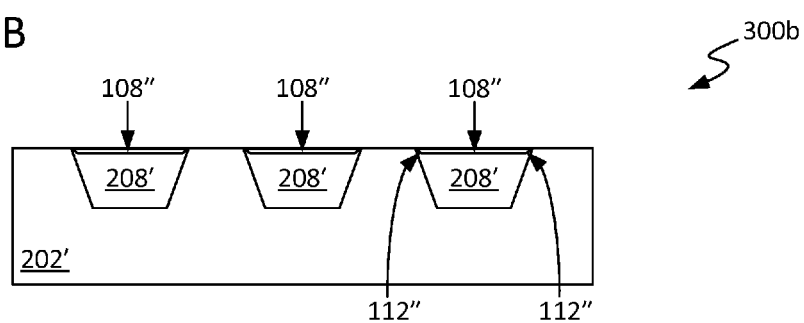
FIG. 9B is a cross-sectional view of the IC of FIG. 8 including an extended substrate, in accordance with an embodiment of the present disclosure.
Figure 9B:
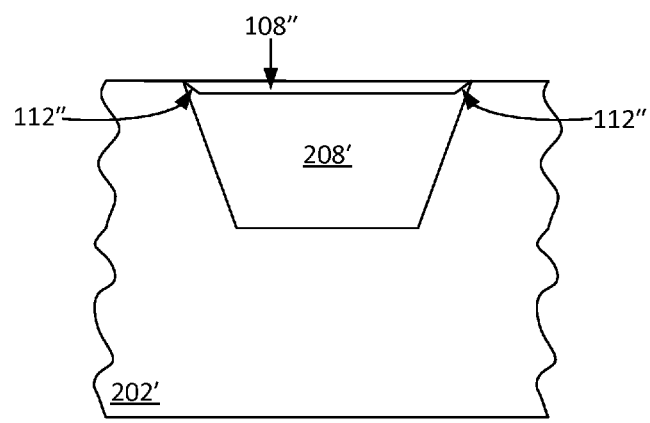

FIGS. 1-8 illustrate an integrated circuit (IC) fabrication process flow, and FIGS. 9A-9B illustrate some example downstream heterogeneous integration options, in accordance with some embodiments of the present disclosure. As described herein, the disclosed processes can be used to form any of a wide variety of IC structures, such as, for example, the IC 300a of FIG. 9A and/or the IC 300b of FIG. 9B. Other IC structures which can be formed using the disclosed techniques will depend on a given application and will be apparent in light of this disclosure.

The process may begin as in FIG. 1, which is a cross-sectional view of an integrated circuit 100 including a substrate 102 and a patterned dielectric layer 104, in accordance with an embodiment of the present disclosure. Substrate 102 can be formed from any suitable material (or combination of materials), such as silicon (Si) and/or silicon germanium (SiGe). Also, substrate 102 can have any of a wide range of configurations, including, for example: a bulk substrate; a silicon-on-insulator (SOI) structure; a wafer; and/or a multi-layered structure. Furthermore, the dimensions of substrate 102 can be customized for a given target application or end-use. Other suitable materials, configurations, and dimensions for substrate 102 will depend on a given application and will be apparent in light of this disclosure.

The dielectric layer 104 formed over substrate 102 can be formed from any suitable insulator or dielectric material (or combination of such materials). For example, in some cases, dielectric layer 104 may be formed from: a nitride, such as silicon nitride ($Si_3N_4$); an oxide, such as silicon dioxide ($SiO_2$) or aluminum oxide ($Al_2O_3$); and/or a combination of any one or more of the aforementioned materials. In some cases, dielectric layer 104 may be an inter-layer dielectric (ILD). As will be appreciated in light of this disclosure, it may be desirable, in some instances, to select the material(s) of dielectric layer 104 so as to prevent or otherwise reduce the likelihood of growth of semiconductor layer 108 thereon (e.g., to minimize the opportunity for nucleation of semiconductor layer 108 thereon). Other suitable materials for dielectric layer 104 will depend on a given application and will be apparent in light of this disclosure.

Also, dielectric layer 104 can be formed over substrate 102 using any suitable technique (or combination of techniques). For example, in some cases, dielectric layer 104 may be formed over IC 100 using: a chemical vapor deposition (CVD) process; and/or a spin-on deposition (SOD) process. Other suitable techniques for forming dielectric layer 104 will depend on a given application and will be apparent in light of this disclosure.

Furthermore, the dimensions of dielectric layer 104 can be customized. For example, in some cases, dielectric layer 104 may have a thickness in the range of about 100-500 nm (e.g., about 250±50 nm, or any other sub-range in the range of about 100-500 nm). In some instances, dielectric layer 104 may have a substantially uniform thickness over the topography provided by the underlying substrate 102. Other suitable dimensions for dielectric layer 104 will depend on a given application and will be apparent in light of this disclosure.

As can be seen further, dielectric layer 104 may be patterned with one or more openings 106. The one or more openings 106 of dielectric layer 104 can be formed using any suitable technique (or combination of techniques). For example, in some cases, the one or more openings 106 of dielectric layer 104 may be patterned using any suitable lithography techniques (e.g., via/trench pattern, etch, polish, clean, etc., as typically done). In some cases, it may be desirable to utilize a dry etch process in forming the one or more openings 106, for example, to ensure the desired degree of anisotropy. Other suitable techniques for forming the one or more openings 106 in dielectric layer 104 will depend on a given application and will be apparent in light of this disclosure.

Also, the geometry and spacing of the one or more openings 106 of dielectric layer 104 can be customized. For example, in some cases, a given opening 106 may have a generally well-like or trench-like configuration having a substantially rectangular cross-sectional profile (e.g., as can be seen generally from FIG. 1). In some cases, a given opening 106 may have substantially vertical sidewalls (e.g., substantially perpendicular to the surface of the underlying substrate 102). In some other cases, a given opening 106 may have a curved (e.g., U-shaped) cross-sectional geometry or a hexagonal cross-sectional geometry. In some instances, neighboring openings 106 may be substantially equidistantly spaced from one another (e.g., may exhibit a substantially constant spacing within dielectric layer 104). In some other instances, however, the spacing of the one or more openings 106 within dielectric layer 104 may be varied as desired. Other suitable geometries and spacing for the one or more openings 106 of dielectric layer 104 will depend on a given application and will be apparent in light of this disclosure.

Furthermore, the dimensions of a given opening 106 can be customized. For example, in some cases, a given opening 106 of dielectric layer 104 may have a height 'H' in the range of about 100-500 nm (e.g., about 250±50 nm, or any other sub-range in the range of about 100-500 nm). As can be seen, a given opening 106 can be configured to traverse the entire thickness of dielectric layer 104, such that substrate 102 (or other underlying layer) is exposed in that region, in accordance with some embodiments. In some cases, a given opening 106 may have a width 'W' in the range of about 50-300 nm (e.g., about 100-150 nm, or any other sub-range in the range of about 50-300 nm). In some instances, the width 'W' of a given opening 106 may be substantially constant throughout its cross-sectional profile; that is, a given opening 106 may be formed within dielectric layer 104 such that the associated sidewalls which contribute to defining the bounds of that opening 106 are substantially perpendicular to the surface of substrate 102 (or other underlying layer). In a more general sense, it may be desirable to ensure that a given opening 106 formed in dielectric layer 104 has an aspect ratio sufficient to provide for the desired degree of aspect ratio trapping (ART) of defects 110 of semiconductor layer 108, as described herein. To that end, in some cases, a given opening 106 may be provided with a height-to-width (H/W) aspect ratio in the range of about 2:1 to 5:1 (e.g., about 3:1 to 4:1, or any other sub-range in the range of about 2:1 to 5:1). In some other instances, H/W aspect ratios greater than about 5:1 may be provided as desired. Other suitable dimensions for the one or more openings 106 of dielectric layer 104 will depend on a given application and will be apparent in light of this disclosure.

Figure 2:
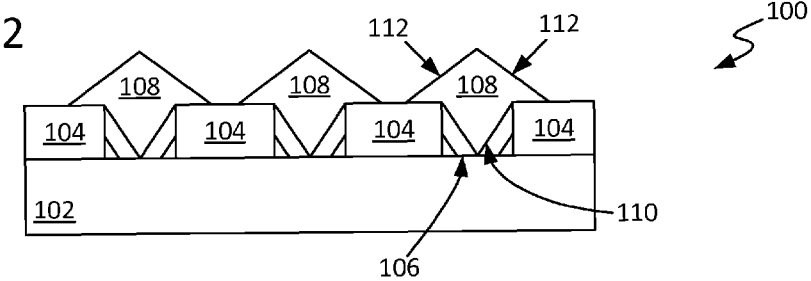
FIG. 2 is a cross-sectional view of the IC of FIG. 1 after formation of a semiconductor layer, in accordance with an embodiment of the present disclosure.
Figure 2:
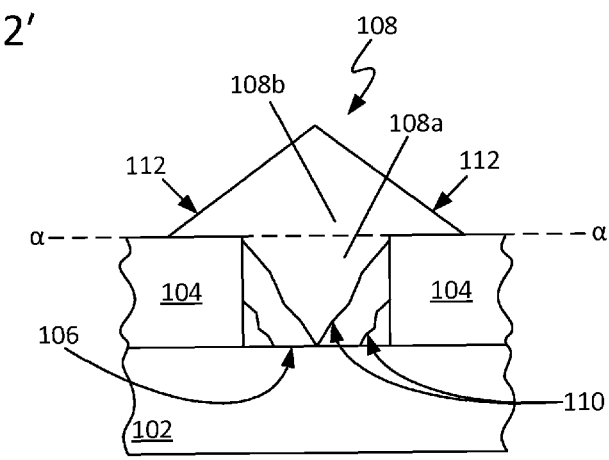

The process may continue as in FIG. 2, which is a cross-sectional view of the IC 100 of FIG. 1 after formation of a semiconductor layer 108, in accordance with an embodiment of the present disclosure. Semiconductor layer 108 can be formed from any suitable semiconductor material (or combination of materials). For example, in some embodiments, semiconductor layer 108 may be formed from a semiconductor material that is lattice-mismatched with the underlying substrate 102. That is, if substrate 102 is formed from silicon (Si), for example, then semiconductor layer 108 may be formed from: germanium (Ge); and/or a III-V compound, such as gallium arsenide (GaAs), indium gallium arsenide (InGaAs), gallium nitride (GaN), or indium phosphide (InP). Other suitable materials for semiconductor layer 108 will depend on a given application and will be apparent in light of this disclosure.

Semiconductor layer 108 can be formed over IC 100 using any suitable technique (or combination of techniques). For example, in accordance with some embodiments, semiconductor layer 108 may be formed over IC 100 using: an epitaxy process including aspect ratio trapping (ART); and/or an epitaxial lateral overgrowth (ELO) process. Other suitable techniques for forming semiconductor layer 108 will depend on a given application and will be apparent in light of this disclosure.

As semiconductor layer 108 is formed over IC 100, it may begin its growth/deposition, at least in part, within the one or more openings 106 of dielectric layer 104. For example, consider FIG. 2', which is an enlarged view of a portion of the IC 100 of FIG. 2 illustrating an example constituent semiconductor structure of semiconductor layer 108. As can be seen, as its formation progresses, semiconductor layer 108 may come to substantially fill the one or more openings 106 of dielectric layer 104 and eventually extend therefrom to overlap dielectric layer 104, at least in part. Thus, and in accordance with some embodiments, semiconductor layer 108 may be formed over IC 100, for example, as one or more three-dimensional, island-like semiconductor structures which, in the aggregate, define the semiconductor layer 108. However, the island-like structures may remain discrete from one another so as not to form a continuous layer over the underlying topography of dielectric layer 104 and substrate 102 (and any other intermediate layers optionally included), in accordance with some embodiments.

The geometry and spacing of a given constituent structure of semiconductor layer 108 can be customized for a given target application or end-use and may depend, at least in part, on the geometry and spacing of its associated opening 106. Thus, and in accordance with some embodiments, a given constituent structure of semiconductor layer 108 may include, for example: a lower portion 108a (e.g., that portion of layer 108 which generally resides below the dashed line α of FIG. 2'); and an upper portion 108b (e.g., that portion of layer 108 which generally resides above the dashed line α of FIG. 2'). In some cases, the lower portion 108a of a given structure may be formed so as to conform substantially to the geometry/profile of its attendant opening 106. For example, if a given opening 106 is provided with a generally well-like or trench-like configuration having a substantially rectangular cross-sectional profile (e.g., as can be seen generally from FIG. 1), then a lower portion 108a of semiconductor layer 108 may exhibit a substantially rectangular cross-sectional profile as well (e.g., as can be seen generally from FIG. 2'). In some instances, the upper portion 108b of a given constituent structure of semiconductor layer 108 may exhibit a generally triangular cross-sectional profile. In some other instances, however, upper portion 108b may exhibit a generally trapezoidal cross-sectional profile. Also, in some embodiments, neighboring structures of semiconductor layer 108 may be substantially equidistantly spaced from one another (e.g., may exhibit a substantially constant spacing). In some other embodiments, however, the spacing of the one or more constituent structures of semiconductor layer 108 may be varied, as desired. Other suitable geometries and spacing for the one or more constituent structures of semiconductor layer 108 will depend on a given application and will be apparent in light of this disclosure.

Also, the dimensions of a given constituent structure of semiconductor layer 108 can be customized for a given target application or end-use and may depend, at least in part, on the dimensions of its attendant opening 106 patterned into dielectric layer 104. For example, in some embodiments, the lower portion 108a of a given structure of semiconductor layer 108 may have: a height that is substantially equal to the height 'H' of the attendant opening 106; and/or a width that is substantially equal to the width 'W' of the attendant opening 106. In some embodiments, the height of an upper portion 108b of a given structure of semiconductor layer 108 may be in the range of about 200-500 nm (e.g., about 400-500 nm, or any other suitable sub-range in the range of about 200-500 nm). In some embodiments, the width of an upper portion 108b may be approximately equal to its height and thus may be in the range of about 200-500 nm (e.g., about 400-500 nm, or any other suitable sub-range in the range of about 200-500 nm). In some instances, the height and/or width of the upper portion 108b of a given structure of semiconductor layer 108 may vary along its cross-sectional profile (e.g., such as in cases in which the upper portion 108b of a given structure of semiconductor layer 108 exhibits a triangular cross-sectional profile, as generally shown in FIG. 2'). Other suitable dimensions for the one or more constituent structures of semiconductor layer 108 will depend on a given application and will be apparent in light of this disclosure.

As can be seen further, for example, from FIG. 2', during formation of semiconductor layer 108 over IC 100, one or more defects 110 (e.g., dislocation defects) may begin to manifest in that layer 108. In some cases, such defects 110 may result, for example, from lattice mismatching between semiconductor layer 108 and underlying substrate 102. However, as a result of providing dielectric layer 104 with one or more openings 106 having an aspect ratio suited for aspect ratio trapping (ART), such defects 110 may be trapped, for example, within the lower portion 108a of a given constituent structure of semiconductor layer 108, in accordance with some embodiments. That is, the one or more defects 110 may undergo ART within the lower portion 108a of semiconductor layer 108, for example, within the confines of an attendant opening 106, below the upper surface of dielectric layer 104 (e.g., at or below height 'H', as generally represented by dashed line α). As can be seen, the defects 110 may be terminated or otherwise curtailed, for example, at the interface of semiconductor layer 108 and the sidewalls of a given opening 106 of dielectric layer 104. In a more general sense, by virtue of how semiconductor layer 108 may be formed to extend from the one or more openings 106, dielectric layer 104 may serve to arrest/trap defects 110 within the confines of openings 106 and/or near substrate 102, thereby preventing or otherwise reducing the ability of such defects 110 to migrate through IC 100 to the top/active layer(s) thereof. It should be noted that the solid lines included in the figures to depict the one or more defects 110 are intended to be generally representative of such defects and are not intended to limit the types and/or characteristics of defects which may result during formation of semiconductor layer 108 over IC 100 or which may undergo ART, as described herein.

As a result of curtailing the one or more defects 110 within lower portion 108a using ART, continued formation of semiconductor layer 108 over IC 100, for example, using an ELO process may generate a crystalline upper portion 108b that is free of defects (e.g., completely free of defects or otherwise substantially free of defects within an acceptable tolerance). In accordance with some embodiments, this defect-free upper portion 108b may extend beyond a given opening 106, above the upper surface of dielectric layer 104 (e.g., at or above height 'H', as generally represented by dashed line α), and over one or more adjacent regions of the upper surface of dielectric layer 104. Thus, as can be seen, for example, from FIG. 2', the upper portion 108b of a given constituent semiconductor structure of semiconductor layer 108 may include one or more crystalline faceted edges 112, which extend, at least in part, over one or more neighboring regions of dielectric layer 104, in accordance with some embodiments.

Figure 3:
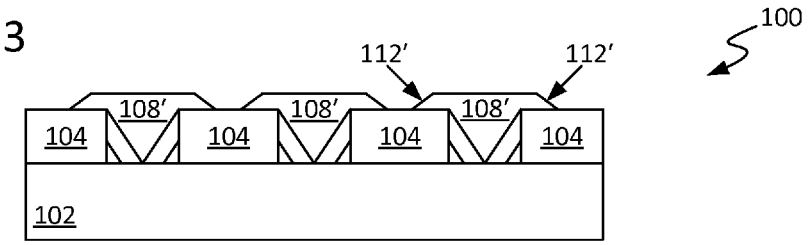
FIG. 3 is a cross-sectional view of the IC of FIG. 2 after planarization thereof, in accordance with an embodiment of the present disclosure.

The process may continue as in FIG. 3, which is a cross-sectional view of the IC 100 of FIG. 2 after planarization thereof, in accordance with an embodiment of the present disclosure. As can be seen here, IC 100 may undergo planarization, at least in part, to reduce the thickness of semiconductor layer 108 (e.g., to reduce the dimensions of the constituent semiconductor structures of semiconductor layer 108). In particular, planarization may reduce the dimensions of the upper portion 108b of a given constituent semiconductor structure of semiconductor layer 108. To that end, and in accordance with some embodiments, IC 100 may undergo, for example, a chemical-mechanical planarization (CMP) process, an etch and clean process, or any other suitable planarization/polish process, as will be apparent in light of this disclosure. The resultant semiconductor layer 108' may include one or more constituent semiconductor structures which exhibit a generally planar/flat upper surface while retaining their one or more crystalline faceted edges 112' (albeit of reduced dimensions), which remain intact over the upper surface of underlying dielectric layer 104. The amount by which semiconductor layer 108 can be reduced to provide semiconductor layer 108' can be customized as desired for a given target application or end-use. For example, in some cases, the upper portion 108b of a given constituent structure may be reduced to a height in the range of about 200-400 nm (e.g., about 300±50 nm, or any other sub-range in the range of about 200-400 nm). Other suitable techniques for planarizing semiconductor layer 108 to provide semiconductor layer 108' will depend on a given application and will be apparent in light of this disclosure.

Figure 4:
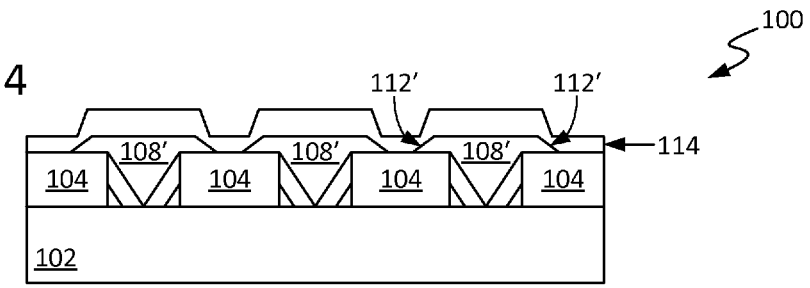
FIG. 4 is a cross-sectional view of the IC of FIG. 3 after formation of an oxide layer, in accordance with an embodiment of the present disclosure.

The process may continue as in FIG. 4, which is a cross-sectional view of the IC 100 of FIG. 3 after formation of an oxide layer 114, in accordance with an embodiment of the present disclosure. Oxide layer 114 can be formed from any suitable oxide material (or combination of such materials). For example, in some embodiments, oxide layer 114 may be formed from: silicon dioxide ($SiO_2$); aluminum oxide ($Al_2O_3$); and/or a combination of any one or more thereof. Other suitable materials for oxide layer 114 will depend on a given application and will be apparent in light of this disclosure.

Also, oxide layer 114 can be formed over IC 100 using any suitable technique (or combination of techniques). For example, in some embodiments, oxide layer 114 may be formed over IC 100 using: a physical vapor deposition (PVD), such as sputtering; a chemical vapor deposition (CVD) process, such as plasma-enhanced CVD (PECVD); and/or a spin-on deposition (SOD) process. Other suitable techniques for forming oxide layer 114 will depend on a given application and will be apparent in light of this disclosure.

Furthermore, the dimensions of oxide layer 114 can be customized. For example, in some embodiments, oxide layer 114 may have a thickness in the range of about 30-100 nm (e.g., about 50±10 nm, or any other sub-range in the range of about 30-100 nm). In some instances, oxide layer 114 may have a substantially uniform thickness over the topography provided, for example, by the underlying semiconductor layer 108' and dielectric layer 104. In some instances, oxide layer 114 may be provided as a substantially conformal layer over such topography. Other suitable dimensions for oxide layer 114 will depend on a given application and will be apparent in light of this disclosure.

Figure 5:
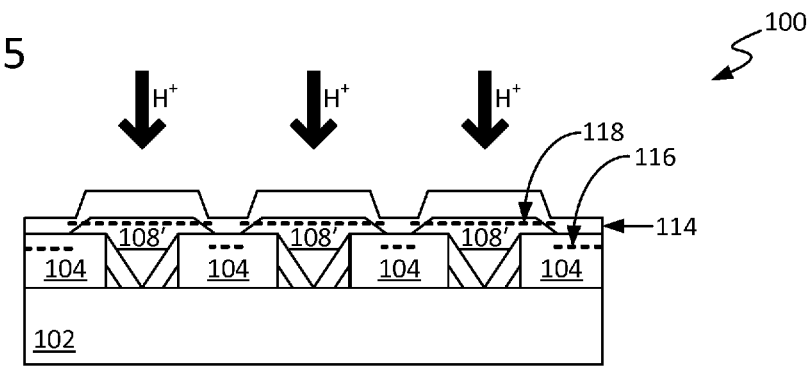
FIG. 5 is a cross-sectional view of the IC of FIG. 4 during or after hydrogen ion implantation, in accordance with an embodiment of the present disclosure.

The process may continue as in FIG. 5, which is a cross-sectional view of the IC 100 of FIG. 4 during or after hydrogen ion implantation, in accordance with an embodiment of the present disclosure. Embedding of hydrogen ions ($H^+$ ions) within IC 100 can be performed using any suitable ion implantation technique (or combination of techniques). As a result of the implantation process, $H^+$ ions may become embedded, for example, within: upper portion 108b of semiconductor layer 108', as generally depicted by dotted lines 118; and/or within dielectric layer 104 (e.g., near the upper surface of dielectric layer 104), as generally depicted by dotted lines 116. As will be appreciated in light of this disclosure, the resultant implantation exhibited by IC 100 may depend, at least in part, on the dosage, implant energy, and/or duration of implantation, each of which can be customized for a given target application or end-use. For example, in some cases, the implantation dosage may be in the range of about $5 \times 10^{16}$-$3 \times 10^{17}$ $H^+$ ions/$cm^2$. In some cases, the implant energy may be in the range of about 30-100 keV (e.g., about 80±10 keV, or any other sub-range in the range of about 30-100 keV). Other suitable dosage ranges and implant energy ranges for hydrogen ion implantation will depend on a given application and will be apparent in light of this disclosure.

Figure 6:
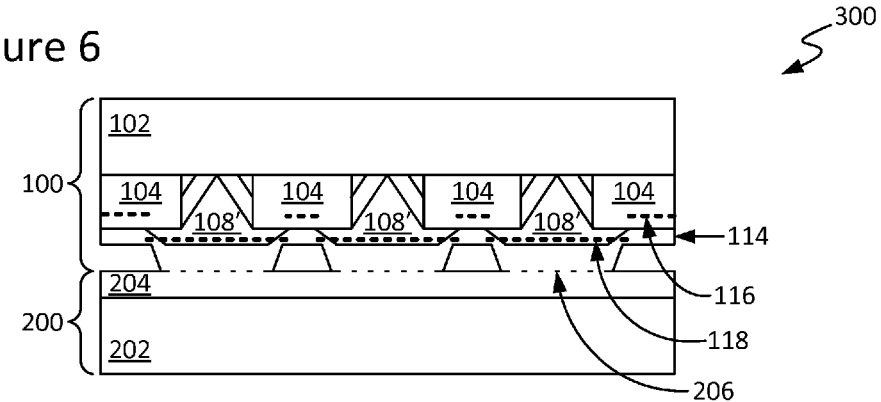
FIG. 6 is a cross-sectional view of the IC of FIG. 5 after bonding thereof with a transfer structure to form another IC, in accordance with an embodiment of the present disclosure.

The process may continue as in FIG. 6, which is a cross-sectional view of the IC 100 of FIG. 5 after bonding thereof with a transfer structure 200 to form an IC 300, in accordance with an embodiment of the present disclosure. As can be seen, the transfer structure 200 with which IC 100 can be bonded may include, for example: a substrate 202; and an oxide layer 204 formed over substrate 202. Substrate 202 can be formed from any suitable material (or combination of materials). For example, in some embodiments, substrate 202 may be formed from: silicon (Si); germanium (Ge); an oxide, such as sapphire ($Al_2O_3$); a dielectric material; and/or a combination of any one or more thereof. Also, substrate 202 may have any of a wide range of configurations, including, for example: a bulk substrate; a silicon-on-insulator (SOI) structure; a wafer; and/or a multi-layered structure. Furthermore, the dimensions of substrate 202 can be customized for a given target application or end-use. Other suitable materials, configurations, and dimensions for substrate 202 will depend on a given application and will be apparent in light of this disclosure.

Oxide layer 204 can be formed from any suitable oxide material (or combination of materials). For example, in some embodiments, oxide layer 204 may be formed from: silicon dioxide ($SiO_2$); aluminum oxide ($Al_2O_3$); and/or a combination of any one or more thereof. Other suitable materials for oxide layer 204 will depend on a given application and will be apparent in light of this disclosure.

Also, oxide layer 204 can be formed over IC 100 using any suitable technique (or combination of techniques). For example, in some embodiments, oxide layer 204 may be formed over IC 100 using: a physical vapor deposition (PVD), such as sputtering; a chemical vapor deposition (CVD) process, such as plasma-enhanced CVD (PECVD); and/or a spin-on deposition (SOD) process. Other suitable techniques for forming oxide layer 204 will depend on a given application and will be apparent in light of this disclosure.

Furthermore, oxide layer 204 can be provided with any desired thickness. For example, in some embodiments, oxide layer 204 may have a thickness in the range of about 30-100 nm (e.g., about 50±10 nm, or any other sub-range in the range of about 30-100 nm). In some instances, oxide layer 204 may have a substantially uniform thickness over the topography provided, for example, by the underlying substrate 202. In some instances, oxide layer 204 may be provided as a substantially conformal layer over such topography. Other suitable dimensions for oxide layer 204 will depend on a given application and will be apparent in light of this disclosure.

During the bonding process, oxide layer 204 of IC 100 and oxide layer 204 of transfer structure 200 may undergo oxide fusion bonding with one another, for example, at one or more points of physical interfacing there between (e.g., as generally represented by the lightly dashed lines 206 included in FIG. 6), in accordance with some embodiments. As a result of the bonding process, transfer structure 200 may become, in a general sense, a handle wafer for IC 100, in accordance with some embodiments.

After bonding of IC 100 with transfer structure 200, the resultant IC 300 may undergo heat treatment, for example, to cause ion cleaving by hydrogen-induced layer exfoliation, in accordance with some embodiments. Such ion cleaving may occur, for instance, within the regions where $H^-$ ions are embedded within dielectric layer 104 and within semiconductor layer 108' (e.g., along the contour generally depicted by the combination of dotted lines 116 and dotted lines 118 of FIG. 6). As a result of ion cleaving, a portion of semiconductor layer 108' (hereinafter, semiconductor layer 108") may be effectively transferred from IC 100 to the transfer structure 200 of IC 300. Also, as a result of ion cleaving, a portion of dielectric layer 104 (hereinafter, dielectric layer 104') may be effectively transferred from IC 100 to the transfer structure 200 of IC 300. Upon separation of IC 300, the remainder of IC 100 that is not bonded with transfer structure 200 may be discarded or otherwise removed/set aside.

The temperature range and/or duration of heat treatment to cause ion cleaving by hydrogen-induced layer exfoliation can be customized for a given target application or end-use. For example, in accordance with some embodiments, while undergoing heat treatment, IC 300 may be exposed to a temperature in the range of about 350-400° C. for about an hour. In some such cases, the exposure temperature may remain substantially constant. Other suitable temperature ranges and duration ranges for heat treatment of IC 300 will depend on a given application and will be apparent in light of this disclosure.

The process may continue as in FIG. 7, which is a cross-sectional view of the IC 300 of FIG. 6 after planarization thereof, in accordance with an embodiment of the present disclosure. As will be appreciated in light of this disclosure, the hydrogen-induced layer exfoliation noted above may result in an IC 300 having a generally jagged surface topography (e.g., along the contour generally depicted by the combination of dotted lines 116 and dotted lines 118 of FIG. 6). However, for subsequent processing, it may be desirable in some instances to provide IC 300 with a smoother surface topography. To that end, and in accordance with some embodiments, IC 300 may undergo, for example, a chemical-mechanical planarization (CMP) process, an etch and clean process, or any other suitable planarization/polish process, as will be apparent in light of this disclosure. Other suitable techniques for planarizing IC 300 will depend on a given application and will be apparent in light of this disclosure.

In accordance with an embodiment, planarization of IC 300 may reduce the jaggedness of its surface topography while: reducing the thickness of semiconductor layer 108" (e.g., reducing the dimensions of the remainder of the upper portions 108b of the one or more constituent semiconductor structures of semiconductor layer 108"); and/or reducing the thickness of combined oxide layer 208. In some cases, the resultant semiconductor layer 108" of IC 300 may include one or more constituent island-like semiconductor structures which exhibit a generally planar/flat upper surface while retaining their one or more crystalline facets 112" (albeit of reduced dimensions), which remain intact within oxide layer 208. The dimensions of a given constituent island-like semiconductor structure of semiconductor layer 108" can be customized for a given target application or end-use. For example, in some cases, a given constituent island-like semiconductor structure of semiconductor layer 108" may have a thickness in the range of about 100-250 nm (e.g., about 200±25 nm, or any other sub-range in the range of about 100-250 nm). Other suitable dimensions for the one or more constituent island-like semiconductor structures of semiconductor layer 108" will depend on a given application and will be apparent in light of this disclosure.

The process may continue as in FIG. 8, which is a cross-sectional view of the IC 300 of FIG. 7 after etching thereof, in accordance with an embodiment of the present disclosure. In some cases, it may be desirable to expose, at least in part, the upper surface of substrate 202, for example, for subsequent processing. To that end, and in accordance with some embodiments, IC 300 may undergo a wet etch process and/or a dry etch process. The etch chemistry may be customized for a given target application or end-use, and, in some cases, may be selective, for example, to etching away the material or materials utilized in oxide layer 208. For example, in some instances in which oxide layer 208 includes silicon dioxide ($SiO_2$) or aluminum oxide ($Al_2O_3$), a fluorine (F)-based etch chemistry may be utilized. Other suitable techniques and etch chemistries for etching oxide layer 208 will depend on a given application and will be apparent in light of this disclosure.

After etching oxide layer 208', a given constituent oxide structure thereof (e.g., underlying a given constituent semiconductor structure of semiconductor layer 108") may have a height, for example, in the range of about 50-200 nm (e.g., about 100±30 nm, or any other sub-range in the range of about 50-200 nm). Also, after etching oxide layer 208', a given constituent oxide structure thereof may have a generally island-like cross-sectional profile having one or more tapered sidewalls (e.g., as generally depicted in FIG. 8). Other suitable dimensions and configurations for a given constituent oxide structure of etched oxide layer 208' will depend on a given application and will be apparent in light of this disclosure.

In accordance with some embodiments, after etching of oxide layer 208 to provide oxide layer 208', the IC 300 of FIG. 8 may undergo formation of a semiconductor layer 210 there over, resulting in an IC 300a, such as that depicted in FIG. 9A. Semiconductor layer 210 can be formed from any of a wide variety of semiconductor materials and in some cases may be different in composition, for instance, from substrate 202, oxide layer 208', and/or semiconductor layer 108". For example, in some cases, semiconductor layer 210 may include silicon germanium (SiGe). As will be appreciated in light of this disclosure, it may be desirable, in some instances, to ensure that semiconductor layer 210 is formed from one or more materials which are relatively closely lattice-matched to substrate 202. Thus, in some cases, semiconductor layer 210 may be considered a heteroepitaxial layer formed over IC 300, resulting in IC 300a. Other suitable materials for semiconductor layer 210 will depend on a given application and will be apparent in light of this disclosure.

Also, semiconductor layer 210 can be formed over IC 300 using any suitable technique (or combination of techniques). For example, in accordance with some embodiments, semiconductor layer 210 may be formed over IC 300 using: a chemical vapor deposition (CVD) process, such as metalorganic chemical vapor deposition (MOCVD); and/or an epitaxy process, such as molecular beam epitaxy (MBE) or metalorganic vapor phase epitaxy (MOVPE). Other suitable techniques for forming semiconductor layer 210 will depend on a given application and will be apparent in light of this disclosure.

Furthermore, semiconductor layer 210 can be provided with any desired thickness. For example, in some cases, semiconductor layer 210 may have a thickness in the range of about 50-200 nm (e.g., about 100±30 nm, or any other sub-range in the range of about 50-200 nm). In some cases, semiconductor layer 210 may have a thickness that is substantially equal to the thickness of oxide layer 208' (e.g., the combined thickness of oxide layer 204 and oxide layer 114'). In some instances, the upper surface of semiconductor layer 210 may be at or below the height of the upper surface of semiconductor layer 108". In some cases, semiconductor layer 210 may have a substantially uniform thickness over the topography provided, for example, by the underlying substrate 202. In some instances, semiconductor layer 210 may be provided as a substantially conformal layer over such topography. Other suitable dimensions for semiconductor layer 210 will depend on a given application and will be apparent in light of this disclosure.

As can be seen, for example, from FIG. 9A', which is an enlarged view of a portion of the IC 300a of FIG. 9A, the resultant IC 300a may exhibit a substantially planar upper surface and include a mismatched semiconductor layer 108" with crystalline faceted edges 112" embedded within oxide layer 208', which in turn is embedded within semiconductor layer 210, in accordance with some embodiments. One or more additional layers and/or components can be populated, for example, on the planar surface collectively provided by mismatched semiconductor layer 108", oxide layer 208', and/ or semiconductor layer 210, in accordance with some embodiments.

In accordance with some other embodiments, after etching of oxide layer 208 to provide oxide layer 208', the IC 300 of FIG. 8 may undergo further formation of substrate 202, resulting in an IC 300b, such as that depicted in FIG. 9B. Substrate 202 may undergo further formation (e.g., homoepitaxial growth) to provide substrate 202' using any suitable technique (or combination of techniques). For example, in accordance with some embodiments, substrate 202' may be formed using: a chemical vapor deposition (CVD) process; and/or a molecular beam epitaxy (MBE) process. Other suitable techniques for further formation of substrate 202 to provide substrate 202' will depend on a given application and will be apparent in light of this disclosure.

Also, substrate 202' can be formed to any desired thickness. For example, in some embodiments, substrate 202' may have a thickness that is substantially equal to the thickness of oxide layer 208' (e.g., the combined thickness of oxide layer 204 and oxide layer 114'). In some instances, the upper surface of substrate 202' may be at or below the height of the upper surface of semiconductor layer 108". In some instances, substrate 202' may have a substantially uniform thickness. Other suitable dimensions for substrate 202' will depend on a given application and will be apparent in light of this disclosure.

As can be seen, for example, from FIG. 9B', which is an enlarged view of a portion of the IC 300b of FIG. 9B, the resultant IC 300b may exhibit a substantially planar upper surface and include a mismatched semiconductor layer 108" with crystalline faceted edges 112" embedded within oxide layer 208', which in turn is embedded within substrate 202', in accordance with some embodiments. One or more additional layers and/or components can be populated, for example, on the planar surface collectively provided by mismatched semiconductor layer 108", oxide layer 208', and/or substrate 202', in accordance with some embodiments.

Example System

Figure 10:
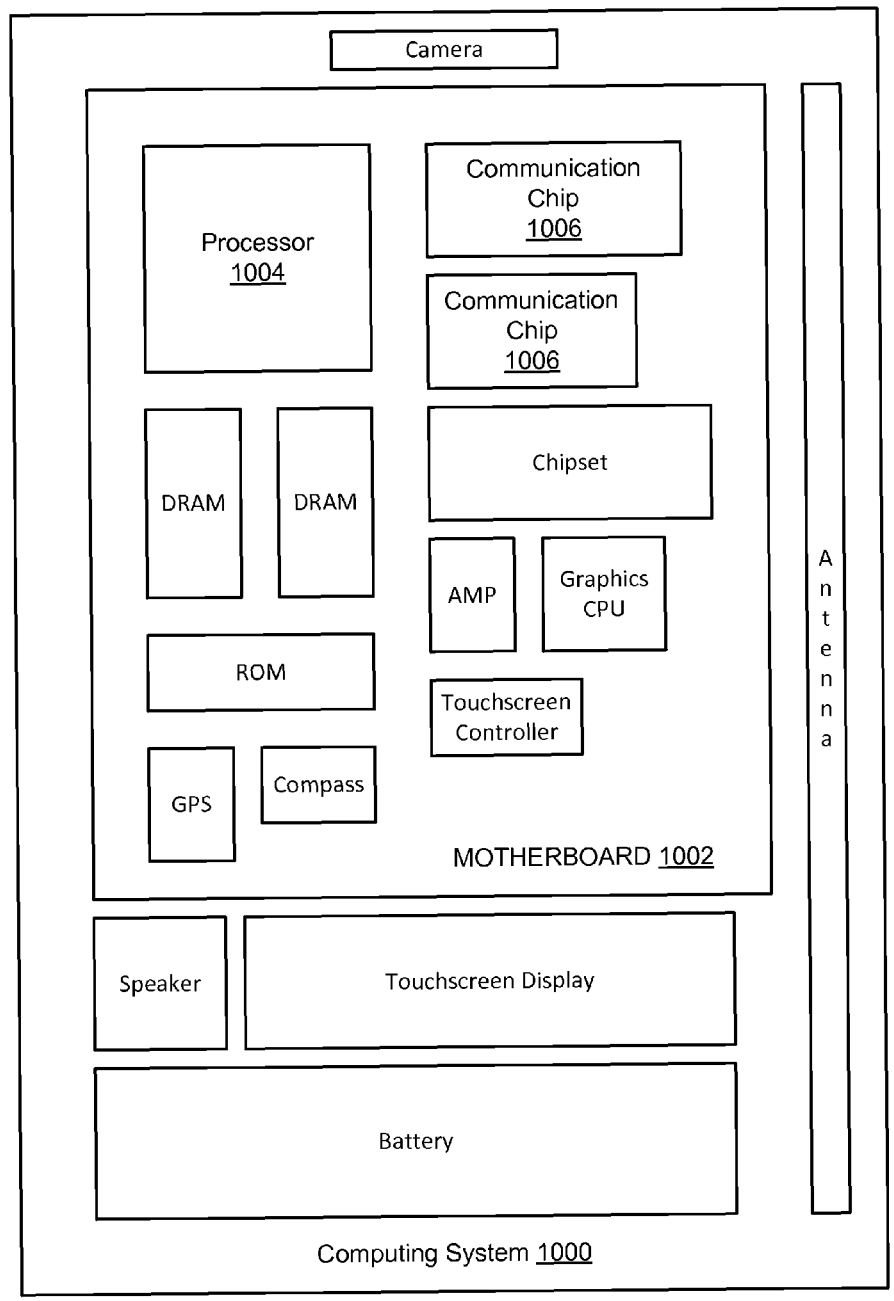
FIG. 10 illustrates a computing system implemented with integrated circuit structures or devices formed using the disclosed techniques in accordance with an example embodiment.

FIG. 10 illustrates a computing system 1000 implemented with integrated circuit structures or devices formed using the disclosed techniques in accordance with an example embodiment. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc. Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is an integrated circuit including: a substrate; an oxide structure formed over a portion of the substrate; and a lattice-mismatched semiconductor structure formed on the oxide structure and embedded within an upper surface thereof, wherein the lattice-mismatched semiconductor structure includes crystalline faceted edges.

Example 2 includes the subject matter of any of Examples 1 and 3-13, wherein the semiconductor structure and the oxide structure collectively provide a planar surface upon which an additional layer and/or component can be populated.

Example 3 includes the subject matter of any of Examples 1-2, 4-6, and 9-13 and further includes a layer of semiconductor material formed on the substrate and at least partially covering one or more sidewalls of the oxide structure.

Example 4 includes the subject matter of Example 3, wherein the semiconductor layer comprises silicon germanium (SiGe).

Example 5 includes the subject matter of Example 3, wherein the semiconductor layer has a thickness in the range of about 50-200 nm.

Example 6 includes the subject matter of Example 3, wherein the semiconductor structure, the oxide structure, and the semiconductor layer collectively provide a planar surface upon which an additional layer and/or component can be populated.

Example 7 includes the subject matter of any of Examples 1-2 and 8-13, wherein the substrate at least partially covers one or more sidewalls of the oxide structure.

Example 8 includes the subject matter of Example 7, wherein the semiconductor structure, the oxide structure, and the substrate collectively provide a planar surface upon which an additional layer and/or component can be populated.

Example 9 includes the subject matter of any of Examples 1-8 and 10-13, wherein the semiconductor structure has a thickness in the range of about 100-250 nm, and wherein the oxide structure has a height in the range of about 50-200 nm.

Example 10 includes the subject matter of any of Examples 1-9 and 11-13, wherein the semiconductor structure is completely free of dislocation defects.

Example 11 includes the subject matter of any of Examples 1-10 and 12-13, wherein the substrate comprises at least one of silicon (Si), germanium (Ge), sapphire ($Al_2O_3$), and/or a dielectric material.

Example 12 includes the subject matter of any of Examples 1-11 and 13, wherein the semiconductor structure comprises at least one of germanium (Ge), gallium arsenide (GaAs), indium gallium arsenide (InGaAs), gallium nitride (GaN), and/or indium phosphide (InP).

Example 13 includes the subject matter of any of Examples 1-12, wherein the oxide structure comprises at least one of silicon dioxide ($SiO_2$) and/or aluminum oxide ($Al_2O_3$).

Example 14 is a method of forming an integrated circuit, the method including: forming a first semiconductor layer over a first substrate, wherein the first semiconductor layer is lattice-mismatched with the first substrate; and transferring a portion of the first semiconductor layer from the first substrate to a second substrate, wherein the transferred portion of the first semiconductor layer includes crystalline faceted edges.

Example 15 includes the subject matter of any of Examples 14 and 16-22, wherein the transferred portion of the first semiconductor layer comprises one or more island-like semiconductor structures which are embedded within a corresponding quantity of oxide structures formed over a portion of the second substrate.

Example 16 includes the subject matter of Example 15, wherein at least one of the island-like semiconductor structures and its corresponding oxide structure collectively provide a planar surface upon which an additional layer and/or component can be populated.

Example 17 includes the subject matter of any of Examples 14-16 and 18-22, wherein forming the first semiconductor layer over the first substrate includes: using a heteroepitaxy process, growing the first semiconductor layer on the first substrate within one or more openings patterned into a dielectric layer formed over the first substrate; and using an epitaxial lateral overgrowth (ELO) process, further growing the first semiconductor layer over at least a portion of an upper surface of the dielectric layer.

Example 18 includes the subject matter of Example 17, wherein the one or more openings patterned into the dielectric layer have a height-to-width aspect ratio that provides for aspect ratio trapping (ART) of dislocation defects originating from interfacing of the first substrate with the lattice-mismatched first semiconductor layer.

Example 19 includes the subject matter of any of Examples 14-18 and 20-22, wherein transferring the portion of the first semiconductor layer from the first substrate to the second substrate includes: performing hydrogen (H)-based layer exfoliation.

Example 20 includes the subject matter of any of Examples 14-19 and 22 and further includes: using a heteroepitaxy process, forming a second semiconductor layer on the second substrate.

Example 21 includes the subject matter of any of Examples 14-19 and 22 and further includes: using a homoepitaxy process, further forming the second substrate.

Example 22 is an integrated circuit formed using the method including the subject matter of any of Examples 14-21.

Example 23 is a method of forming an integrated circuit, the method including: forming a dielectric layer over a first substrate and patterning one or more openings into the dielectric layer; forming a first semiconductor layer over the first substrate and patterned dielectric layer, wherein the first semiconductor layer is lattice-mismatched with the first substrate; planarizing the first semiconductor layer; forming a first oxide layer over a topography provided by the planarized first semiconductor layer and patterned dielectric layer; bonding the first oxide layer with a second oxide layer formed over a second substrate; transferring to the second substrate at least a portion of each of the resultant bonded oxide layer and planarized first semiconductor layer; planarizing the transferred portions of the bonded oxide layer and first semiconductor layer; and etching the resultant planarized bonded oxide layer to expose an upper surface of the underlying second substrate.

Example 24 includes the subject matter of any of Examples 23 and 25-42, wherein the dielectric layer comprises at least one of silicon nitride ($Si_3N_4$), silicon dioxide ($SiO_2$), and/or aluminum oxide ($Al_2O_3$).

Example 25 includes the subject matter of any of Examples 23-24 and 26-42, wherein the dielectric layer has a thickness in the range of about 100-500 nm.

Example 26 includes the subject matter of any of Examples 23-25 and 27-42, wherein the one or more openings patterned into the dielectric layer have a height-to-width aspect ratio which provides for aspect ratio trapping (ART) of dislocation defects originating from interfacing of the first substrate with the lattice-mismatched first semiconductor layer.

Example 27 includes the subject matter of any of Examples 23-26 and 28-42, wherein the one or more openings patterned into the dielectric layer have a height-to-width aspect ratio in the range of about 2:1 to 5:1.

Example 28 includes the subject matter of any of Examples 23-27 and 29-42, wherein the first substrate comprises at least one of silicon (Si) and/or silicon germanium (SiGe).

Example 29 includes the subject matter of any of Examples 23-28 and 30-42, wherein the first semiconductor layer comprises at least one of germanium (Ge), gallium arsenide (GaAs), indium gallium arsenide (InGaAs), gallium nitride (GaN), and/or indium phosphide (InP).

Example 30 includes the subject matter of any of Examples 23-29 and 31-42, wherein forming the first semiconductor layer over the first substrate and patterned dielectric layer includes: using a heteroepitaxy process, growing the first semiconductor layer on the first substrate within the one or more openings patterned into the dielectric layer; and using an epitaxial lateral overgrowth (ELO) process, further growing the first semiconductor layer over at least a portion of an upper surface of the patterned dielectric layer.

Example 31 includes the subject matter of any of Examples 23-30 and 32-42, wherein after planarization, the transferred portion of the first semiconductor layer has a thickness in the range of about 100-250 nm.

Example 32 includes the subject matter of any of Examples 23-31 and 33-42, wherein at least one of the first oxide layer and/or the second oxide layer comprises at least one of silicon dioxide ($SiO_2$) and/or aluminum oxide ($Al_2O_3$).

Example 33 includes the subject matter of any of Examples 23-32 and 34-42, wherein bonding the first oxide layer with the second oxide layer includes: heat treating the integrated circuit at a temperature in the range of about 350-400° C.

Example 34 includes the subject matter of any of Examples 23-33 and 35-42, wherein transferring to the second substrate at least a portion of each of the bonded oxide layer and planarized first semiconductor layer includes: implanting hydrogen (H+) ions within the planarized first semiconductor layer; and performing hydrogen-based layer exfoliation at a temperature in the range of about 350-400° C.

Example 35 includes the subject matter of Example 34, wherein implanting the H+ ions is performed using an implantation dosage in the range of about $5 \times 10^{16}$ H+ ions/cm$^2$ to $3 \times 10^{17}$ H ions/cm$^2$.

Example 36 includes the subject matter of Example 34, wherein implanting the H+ ions is performed using an implantation energy in the range of about 30-100 keV.

Example 37 includes the subject matter of any of Examples 23-36,38, and 40-42 and further includes: heteroepitaxially growing a second semiconductor layer on the second substrate.

Example 38 includes the subject matter of Example 37, wherein the second semiconductor layer comprises silicon germanium (SiGe).

Example 39 includes the subject matter of any of Examples 23-36 and 40-42 and further includes: homoepitaxially growing the second substrate.

Example 40 includes the subject matter of any of Examples 23-39 and 41-42, wherein the second substrate comprises at least one of silicon (Si), germanium (Ge), sapphire (Al$_2$O$_3$), and/or a dielectric material.

Example 41 is a p-type metal-oxide-semiconductor (PMOS) device formed using the method including the subject matter of any of Examples 23-40.

Example 42 is an n-type metal-oxide-semiconductor (NMOS) device formed using the method including the subject matter of any of Examples 23-40.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future-filed applications claiming priority to this application may claim the disclosed subject matter in a different manner and generally may include any set of one or more limitations as variously disclosed or otherwise demonstrated herein.

What is claimed is:

1. An integrated circuit comprising:
   a substrate;
   an oxide structure formed over a portion of the substrate; and
   a lattice-mismatched semiconductor structure formed entirely on and embedded within an upper surface of the oxide structure beneath it, wherein the lattice-mismatched semiconductor structure includes crystalline faceted edges.

2. The integrated circuit of claim 1, wherein the semiconductor structure and the oxide structure collectively provide a planar surface upon which at least one of an additional layer and a component can be populated.

3. The integrated circuit of claim 1 further comprising a layer of semiconductor material formed on the substrate and at least partially covering one or more sidewalls of the oxide structure.

4. The integrated circuit of claim 3, wherein the semiconductor structure, the oxide structure, and the semiconductor layer collectively provide a planar surface upon which at least one of an additional layer and a component can be populated.

5. The integrated circuit of claim 1, wherein the substrate at least partially covers one or more sidewalls of the oxide structure.

6. The integrated circuit of claim 5, wherein the semiconductor structure, the oxide structure, and the substrate collectively provide a planar surface upon which at least one of an additional layer and a component can be populated.

7. The integrated circuit of claim 1, wherein the semiconductor structure has a bottom surface that is entirely in contact with the oxide structure.

8. The integrated circuit of claim 1, wherein the substrate comprises at least one of silicon (Si), germanium (Ge), sapphire (Al$_2$O$_3$), and a dielectric material.

9. The integrated circuit of claim 1, wherein the semiconductor structure comprises at least one of germanium (Ge), gallium arsenide (GaAs), indium gallium arsenide (InGaAs), gallium nitride (GaN), and indium phosphide (InP).

10. The integrated circuit of claim 1, wherein the oxide structure comprises at least one of silicon dioxide (SiO$_2$) and aluminum oxide (Al$_2$O$_3$).

11. A method of forming an integrated circuit, the method comprising:
    forming a first semiconductor layer over a first substrate, wherein the first semiconductor layer is lattice-mismatched with the first substrate; and
    transferring a portion of the first semiconductor layer from the first substrate to a second substrate, wherein the transferred portion of the first semiconductor layer includes crystalline faceted edges.

12. The method of claim 11, wherein forming the first semiconductor layer over the first substrate comprises:
    using a heteroepitaxy process, growing the first semiconductor layer on the first substrate within one or more openings patterned into a dielectric layer formed over the first substrate; and
    using an epitaxial lateral overgrowth (ELO) process, further growing the first semiconductor layer over at least a portion of an upper surface of the dielectric layer.

13. The method of claim 12, wherein the one or more openings patterned into the dielectric layer have a height-to-width aspect ratio that provides for aspect ratio trapping ART) of dislocation defects originating from interfacing of the first substrate with the lattice-mismatched first semiconductor layer.

14. The method of claim 11 further comprising:
    using a heteroepitaxy process, forming a second semiconductor layer on the second substrate.

15. The method of claim 11 further comprising:
    using a homoepitaxy process, further forming the second substrate.

16. A method of forming an integrated circuit, the method comprising:
    forming a dielectric layer over a first substrate and patterning one or more openings into the dielectric layer;
    forming a first semiconductor layer over the first substrate and patterned dielectric layer, wherein the first semiconductor layer is lattice-mismatched with the first substrate;
    planarizing the first semiconductor layer;
    forming a first oxide layer over a topography provided by the planarized first semiconductor layer and patterned dielectric layer;
    bonding the first oxide layer with a second oxide layer formed over a second substrate;

transferring to the second substrate at least a portion of each of the resultant bonded oxide layer and planarized first semiconductor layer;

planarizing the transferred portions of the bonded oxide layer and first semiconductor layer; and etching the resultant planarized bonded oxide layer to expose an upper surface of the underlying second substrate.

17. The method of claim 16, wherein the one or more openings patterned into the dielectric layer have a height-to-width aspect ratio in the range of about 2:1 to 5:1.

18. The method of claim 16, wherein forming the first semiconductor layer over the first substrate and patterned dielectric layer comprises:

using a heteroepitaxy process, growing the first semiconductor layer on the first substrate within the one or more openings patterned into the dielectric layer; and using an epitaxial lateral overgrowth (ELO) process, further growing the first semiconductor layer over at least a portion of an upper surface of the patterned dielectric layer.

19. The method of claim 16, wherein transferring to the second substrate at least a portion of each of the bonded oxide layer and planarized first semiconductor layer comprises:

implanting hydrogen ($H^+$) ions within the planarized first semiconductor layer; and performing hydrogen-based layer exfoliation at a temperature in the range of about 350-400° C.

20. The method of claim 19, wherein implanting the $H^+$ ions is performed using an implantation dosage in the range of about $5 \times 10^{16}$ $H^+$ ions/cm$^2$ to $3 \times 10^{17}$ $H^+$ ions/cm$^2$.

21. The method of claim 19, wherein implanting the $H^+$ ions is performed using an implantation energy in the range of about 30-100 keV.

22. The method of claim 16 further comprising:

heteroepitaxially growing a second semiconductor layer on the second substrate.

23. The method of claim 16 further comprising:

homoepitaxially growing the second substrate.

24. A p-type metal-oxide-semiconductor (PMOS) device formed using the method of claim 16.

25. An n-type metal-oxide-semiconductor (NMOS) device formed using the method of claim 16.

* * * * *